Figure 1:
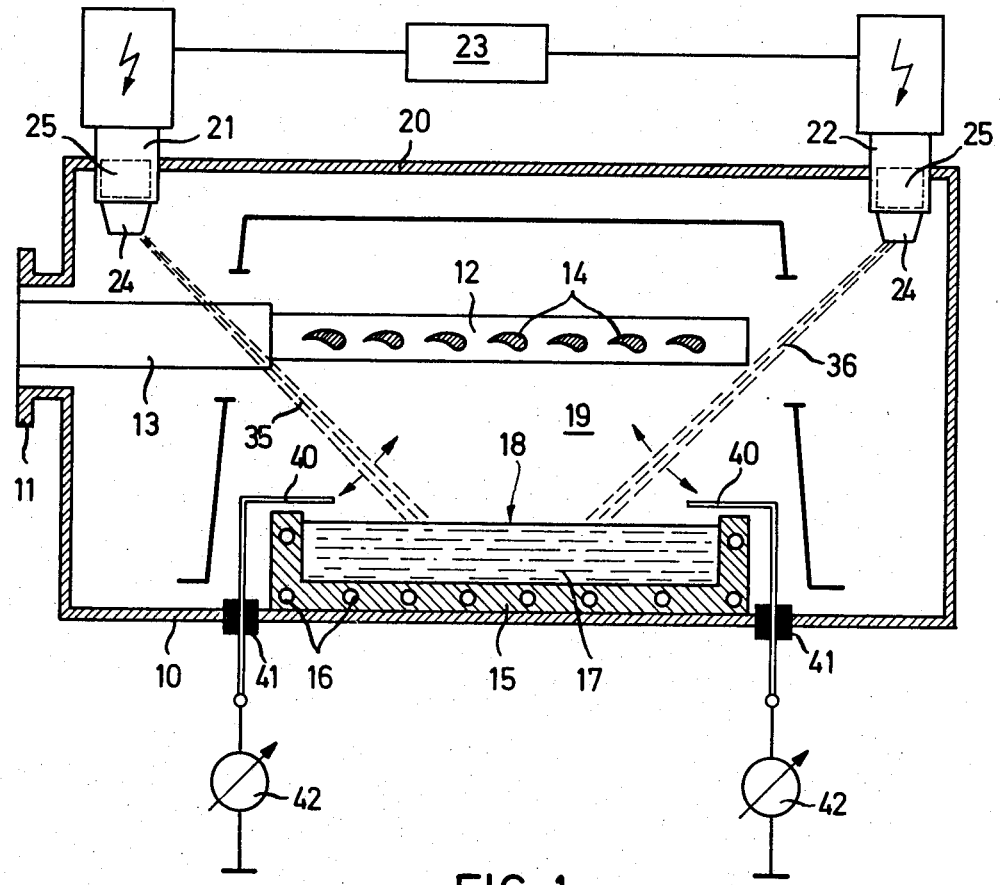

United States Patent [19]

Dietrich et al.

[11] 4,233,515
[45] Nov. 11, 1980

[54] INSTRUMENT FOR DETERMINING THE RADIATION PARAMETERS OF A FOCUSED CHARGED-PARTICLE BEAM AND METHOD

[75] Inventors: Walter Dietrich, Hanau am Main; Herbert Stephan, Bruchköbel, both of Fed. Rep. of Germany

[73] Assignee: Leybold-Heraeus GmbH, Cologne, Fed. Rep. of Germany

[21] Appl. No.: 964,091

[22] Filed: Nov. 24, 1978

[30] Foreign Application Priority Data

Jul. 19, 1978 [DE] Fed. Rep. of Germany ....... 2831602

[51] Int. Cl.² .............................................. G01K 1/08
[52] U.S. Cl. .................... 250/397; 250/398; 250/492 B; 219/121 EB
[58] Field of Search ............... 250/492 A, 492 B, 397, 250/398, 425; 324/71 EB; 219/121 EB, 121 EM; 313/359, 361

[56] References Cited

U.S. PATENT DOCUMENTS

| | | | |
|---|---|---|---|
| 3,547,074 | 12/1970 | Hirschfeld | 250/492 A |
| 3,699,304 | 10/1972 | Baldwin et al. | 250/492 A |
| 3,699,439 | 10/1972 | Turner | 324/71 EB |
| 3,784,909 | 1/1974 | Schutt | 250/397 |
| 3,864,597 | 2/1975 | Trotel | 250/492 A |

Primary Examiner—Bruce C. Anderson
Attorney, Agent, or Firm—Sprung, Felfe, Horn, Lynch & Kramer

[57] ABSTRACT

Method and device for determining the radiation parameters of a focused beam of charged particles guided periodically over a target surface, especially in an electron beam melting and vaporizing system wherein the target is the surface of a melt. At least one probe is positioned in front of the target surface in the direction of radiation and within the beam trace, the probe being connected to an electrical display device. The output signal of the probe is displayed via a cathode ray tube and the reversal point of the charged-particle beam is determined on the basis of the time interval between the signal peaks in conjunction with the velocity of the beam movement.

15 Claims, 4 Drawing Figures

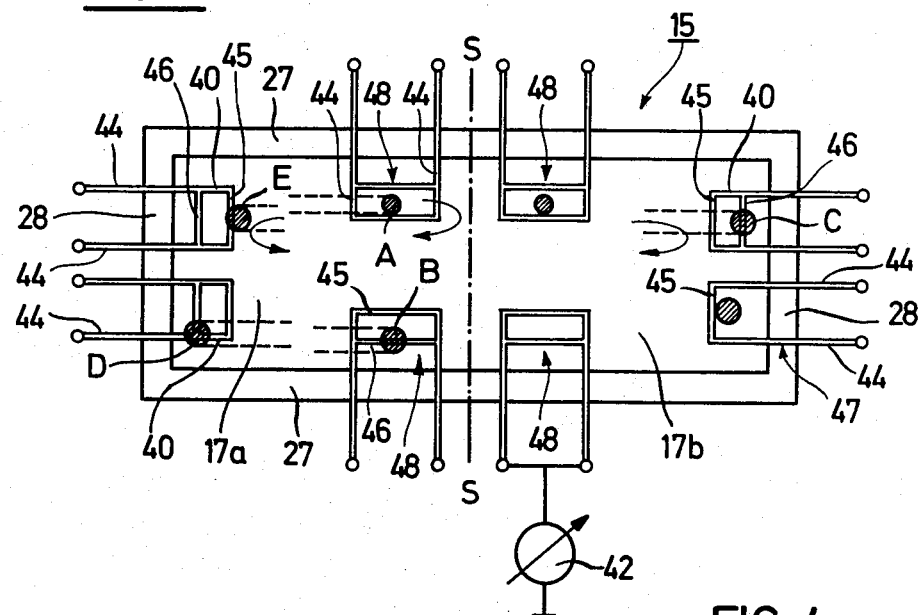
FIG. 2
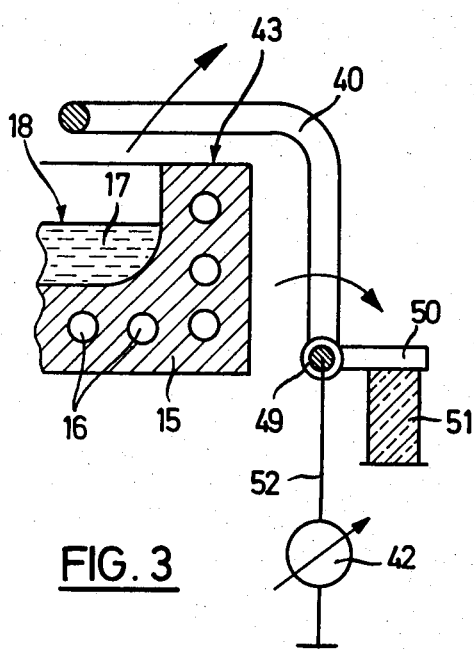
FIG. 3
FIG. 4

INSTRUMENT FOR DETERMINING THE RADIATION PARAMETERS OF A FOCUSED CHARGED-PARTICLE BEAM AND METHOD

BACKGROUND

This invention relates to an instrument for the determination of radiation parameters of a focused charged-particle beam periodically guided over a target surface, especially in electron beam melting and vaporizing, the target surface being the surface of a melt. The invention also concerns measuring processes using this instrument.

In the use of electron beams it is frequently desired to detect the radiation parameters themselves, including the state of focus or focal spot diameter on the target surface, as well as the pattern of deflection of the electron beam on a target surface that is many times larger than the focus spot. The target surface can be scanned or swept by the electron beam along X-Y coordinates, for example.

The determination of radiation parameters is especially important in the vaporization of mixtures or alloys of materials having different melting and boiling points. In such cases, the individual components of the mixture or alloy are subject to different rates of vaporization, resulting in local changes of the composition of the mixture or alloy in the vaporizing crucible. Details concerning the behavior of molten alloys in vaporization as well as measures for their control are described in German published application No. 28 12 285.

A vacuum depositing process has become known in which an electrical probe is disposed above the surface and in the stream of the vapor of the vaporizing material, which is connected to an electrical indicating instrument. This probe serves, however, only for the determination of the rate of vaporization. Electrically charged vapor particles condense on the probe, and the charge that is yielded to the probe is a measure of the quantity of vapor per unit of time. The probe in question, however, is not placed in the path of an electron beam; it must not even be struck by the electron beam, because the latter would signal a non-existent high vaporization rate due to the charge which it would yield to the probe. This probe, therefore, is not an instrument for the determination of radiation parameters of a charged-particle beam.

SUMMARY

This invention provides an instrument of the kind described above, which will make it possible to determine different radiation parameters as well as the disposition of the charged-particle beam in relation to the target surface, doing so in an extremely simple and reliable manner.

This is achieved in accordance with the invention, in the instrument described above, in that at least one probe is disposed over the target surface and within the trace of the beam and is connected to an electrical indicating instrument.

DESCRIPTION

The position of the probe in space with respect to the surface that is the target of the beam can be used for the purpose of obtaining an indication of the impingement of the charge carrying beam on the probe. In the simplest case, the probe could consist of a metal frame, such as a square loop of wire conforming to the outer periphery of the target surface. Each impingement of the charged-particle beam on the probe, or each passage of the beam over the probe, would be expressed in an electrical impulse which can be visually signaled. In the case of a rectangular vaporizing crucible, for example, such a probe could have the shape of a rectangle in which the individual sides are at a certain distance from the edges of the crucible. The purpose of this is to prevent the electron beam from striking the edge of the crucible where it might damage the crucible or at least might produce extremely undesirable contamination by the partial evaporation of the material of the crucible. It is possible to special advantage, however, to divide the probe along the circumference of the vaporizing crucible into individual sections and to connect these sections to different indicator means or to connect a single indicator means cyclically to the probes. In this manner the radiation parameters can be tested independently of one another locally, i.e., at different points on the target surface.

It is especially advantageous to make the probe from an electrically conductive wire whose width is smaller than the beam diameter. The material of the probe is, of course, preferably a metal of high melting point, it being also possible to use for the probes thin tubing through which a coolant is circulated. The thinner the probe is, the greater will be its resolving power.

If an electron beam of given dimensions is moved transversely across the probe, it will produce an impulse of approximately sinusoidal form, the amplitude and the distance between the flanks of the pulse providing indexes of the state of the focus of the charge carrying beam. The greater the amplitude and the smaller the distance between the flanks of the pulse are, the more sharply the beam is focused, and vice versa.

The instrument of the invention can be further developed by disposing two or more wires successively along the path of movement of the beam. In this manner the positioning of the beam on the target surface, and especially of the point of its reversal at the end of the target surface, can be located more precisely.

The positioning of the reversal points, however, can also be performed by means of a single wire disposed at the direction of beam movement, this being accomplished by a measuring process in which the probe output signal is displayed by means of a cathode ray tube. If the reversal point is situated beyond the wire, the charged-particle beam will produce a first impulse when it passes over the wire on its excursion, and a second impulse when it passes over the wire on its return. It will then be easy to determine the location of the reversal point of the beam on the basis of the time lapse between the signal peaks in conjunction with the velocity of the beam movement or deflection.

On the other hand, however, the probe can also consist of a U-shaped wire loop whose crossbar is straight and aligned parallel with the beam movement. If the crossbar is situated within the trace of the beam, the charged-particle beam will produce a pulse beginning when it first encounters the crossbar and ending when it leaves it, the length of the pulse being proportional to the length of the crossbar and inversely proportional to the deflection velocity of the electron beam at the probe. The deflection velocity of the charged-particle beam at the probe can be determined simply on the basis of the time lapse between the flanks of the signal in conjunction with the length of the crossbar.

This probe can be further developed in accordance with the further invention by making it to consist of a U-shaped wire loop having an additional, electrically conductive wire shunt that is parallel to its crossbar and conductively connected to the probe. When such a probe is mounted adjacent the crucible wall, it is possible to analyze the beam trace more precisely in the area of the crucible wall, i.e., the "resolving power" of the probe is increased. In this case, care must be taken to see that the crossbar and the shunt are parallel to the portion of the crucible wall on which the loop is mounted. When the charged-particle beam is scanning the target surface approaches the crossbar and finally impinges upon the crossbar, first a long pulse is produced. Then, when the charged-particle beam approaches more closely to the crucible wall, it first passes over only the two shanks of the wire loop, producing two individual pulses with a distance between their peaks which is proportional to the crossbar length, and inversely proportional to the velocity with which the beam is deflected. As the charged-particle beam continues to approach the crucible wall, it strikes the shunt wire that is parallel to the crossbar wire, and again produces a long pulse which will be identical to the long pulse produced when the crossbar wire was encountered. This process can be accurately timed, so that the observer can tell the position of the focal spot with respect to the crucible wall.

The probe can, in accordance with the further invention, be made in the form of a fine-mesh network whose individual wires form a coordinate system and are connected to a cathode ray tube, so that the trace of the charged-particle beam can be continuously analyzed, even as an integral. It is, of course, possible to connect the output signals of one or more probes to an electronic control system which automatically corrects to the desired radiation parameters. In this manner it is possible to achieve an automatic adjustment of the focus or an automatic control of the position of the sweep pattern with respect to the surface of the vaporizing crucible, and it should be noted that the margins of the sweep pattern are essentially determined by the location of the reversal points of the charged-particle beam.

Examples of the embodiment of the invention using probes of various design will be explained below in conjunction with FIGS. 1 to 4.

FIG. 1 is a vertical cross-sectional view taken through a vacuum depositing apparatus for the discontinuous coating of a plurality of substrates, FIG. 2 is a top plan view of the vaporizing crucible and the surface of the melt with probes of various forms in various positions over the target surface, FIG. 3 is a detail of a probe that can be swung out of the path of the beam, and FIG. 4 presents several diagrams a to e of various signals produced by the various probes from certain beam movements.

In FIG. 1 there is represented a vacuum chamber 10 which has on the left side a connection flange 11 for connection to an airlock chamber and a preheating chamber, neither of which is shown. A substrate holder 12, which is fastened to a transport stem 13, extends horizontally into the vacuum chamber 10. A plurality of substrates 14, in the form of turbine blades, are fastened to the substrate holder 12 in such a manner that they virtually completely cover the horizontal surface assigned to them, with the exception of a slight separation.

A vaporizing crucible 15 consisting of metal (copper) and provided with cooling passages 16 is disposed underneath the substrate holder 12. In the vaporizing crucible is a bath 17 of molten vaporization material whose surface (identified by the number 18) contains the target field of the charged-particle beams. Between the bath surface and the substrates there is formed an approximately quadrangular space 19 through which the vapor stream migrates upwardly from surface 18 to the substrates 14. In the roof 20 of the vacuum chamber 10 there are disposed two electron guns 21 and 22 which are supplied with electrical energy from a control system 23. This control system supplies guns 21 and 22 not only with the required high voltage, but also with the heater current for the cathodes of the guns. Furthermore, the control system 23 also generates the deflection signals required for the charged-particle beams. For beam deflection purposes, the guns 21 and 22 are provided with an X-axis deflection system 24 and a Y-axis deflection system 25. The guns 21 and 22 are disposed above the level of the surface 18 and laterally outside of the vaporizing crucible 15. They produce charged-particle beams 35 and 36 which emerge from the X-axis deflection system 24 and strike surface 18 at an angle and scan the latter in the X and Y directions according to a given pattern.

Above the surface 18 or above the target field, two probes 40 are situated within the beam trace, and they are brought through the walls of the vacuum chamber through lead-through insulators 41 and connected to display instruments 42.

As shown in FIG. 2, the vaporizing crucible 15 has a rectangular plan with two long sides 27 and two short sides 28. Accordingly, the bath 17 is divided by a short axis of symmetry S—S into two halves 17a and 17b. The charged-particle beam 35 (FIG. 1) is associated with the left bath half 17a and the charged-particle beam 36 with the right bath half 17b.

The probes 40 are disposed adjacent the short sides 28 and are situated directly above the surface 18 of bath 17 and the crucible rim 43 (FIG. 3). They consist of a U-shaped wire loop whose crossbar is aligned perpendicular to the beam movement direction that is here being considered. Each wire loop consists of two parallel legs 44 and a crossbar 45 disposed at right angles thereto. An electrically conductive shunt 46 is disposed parallel to the crossbar 45, and is situated in the same plane as the legs and the crossbar. On the right side of FIG. 2 there is shown an additional probe 47 in which the shunt 46 is not present.

Four additional probes 48 are disposed adjacent the long sides 27. The arrangement of all the probes is such that the crossbars 45 and shunts 46 are parallel to that portion of the crucible rim with which they are associated. The legs of the probes, which simultaneously constitute their electrical connections, are in the present case at right angles to the related portion of the crucible rim.

In FIG. 2, focal spots of several electron beams are represented at A, B, C, D and E, it being understood that what are involved are basically the focal spots of two charged-particle beams as shown in FIG. 1, in a variety of positions. The charged-particle beam A moves along a path indicated in broken lines over the two legs 44 of the probe 48, producing in its passage in one direction two voltage pulses which are represented graphically in FIG. 4a and marked 44'. From the distance between the peaks of the two curves it is possible, if the distance between the two legs 44 is known, to calculate the velocity with which the beam A is deflected. The state of its focus can also be arrived at. If the charged-particle beam should be less sharply focused, i.e., if the focal spot should be larger, the beam power would be distributed over a larger area, i.e., the intensity would be lower. On the other hand, the dwell time of the beam on each of the two legs would be correspondingly longer for the same velocity of deflection. This would express itself in the diagram of FIG. 4a in pulses whose amplitude is lower, but which have a greater distance between their flanks, as indicated at 44".

The charged-particle beam B moves along the path indicated in broken lines across the shunt 46 of probe 48, thereby producing a pulse whose shape is represented in the diagram given in FIG. 4b. The same pulse form would develop if the charged-particle beam B were to be guided over the crossbar 45 of probe 48 which is parallel to the shunt wire 46. On a trace between first crossbar 45 and second crossbar 46, a diagram in accordance with FIG. 4a would again be the result. Since the charged-particle beam B is guided over the target field in the manner of a raster, in a manner well known in conjunction with the television picture tube, it first sweeps across the crossbar producing a measuring pulse in accordance with FIG. 4b, and then it produces two pulses in accordance with FIG. 4a, and then again a long pulse in accordance with FIG. 4b. If the charged-particle beam should continue to approach the long side 27 of the crucible 15, a pulse diagram like the one in FIG. 4a would again be produced. On the basis of this time variation it is possible to know precisely the course which the charge carrying beam is following within the range of probe 48.

If a charged-particle beam C encounters the shunt 46 at the end of its trace, which is also indicated by broken lines, i.e., if the point of reversal of beam C is situated on this shunt 46, a pulse diagram is produced in accordance with FIG. 4c, which has three peaks. Two pulses 45' are produced when the charge carrying beam C passes over the crossbar 45; the pulse 46' between them is produced during the dwell of the beam C on the shunt 46. If it does not immediately return along the broken line, i.e., if a longer dwell time on shunt 46 is selected, this will express itself in a correspondingly elongated pulse 46' and by a greater interval between the two pulses 45' in FIG. 4c. If the charged-particle beam C were to be moved into the interstice between the wires 45 and 46, and then its direction were to be reversed, the result would be a pulse diagram similar to FIG. 4a. If the charged-particle beam C, however, were to move further to the right beyond the shunt 46, a total of four pulses would be displayed, since the charged-particle beam would twice contact both crossbar 45 and shunt 46 in its excursion. Thus it is possible, on the basis of the number and position of the parts of the probe, in conjunction with the number of voltage pulses emitted by the probe, to read precisely the trace pursued by the charge carrying beam including its point of reversal. If the deflection velocity is known, it is possible to determine the situation of the reversal point with still greater precision on the basis of the time interval between the pulse peaks.

Continuing on its trace represented in broken lines, the charged-particle beam D moves onto a leg 44 of the lower left probe 40, thereby producing a pulse signal in accordance with FIG. 4d. Here, again, it is possible, if the deflection velocity of the electron beam is known, and allowing for any dwelling of the beam at the point of reversal, to determine the position of the beam precisely on the basis of the distance between the flanks of the pulse.

Lastly, it is also possible to determine the point of reversal of a charged-particle beam E even when it only just touches any part of the probe, such as the crossbar 45 of the upper left probe 40, for example. In this case, a pulse diagram in accordance with FIG. 4e is formed.

A simplified form of a probe 47 is represented at the lower right in FIG. 2. This consists merely of a wire loop having two legs 44 and a crossbar 45. The charged-particle beam, which is not indexed, and is represented in diagonal hatching, twice passes over the crossbar 45 in each of its excursions, thereby forming a pulse signal similar to the one in FIG. 4a. On this basis, too, it is possible to determine precisely the position of the point of reversal between the crossbar 45 and the crucible rim.

In FIG. 3 there is represented a probe 40 which is bent and projects at right angles over the crucible rim 43. The probe 40 is attached at a joint 49 to a support 50 which is held on an insulator 51. The joint 49 is connected by a conductor 52 to a meter 42. When the probe 40 is not needed, it can be swung away on joint 49 out of the path of the beam, so as to protect the probe against heat damage. The operation of the probe can be automated such that the probe will be swung into the beam trace at regular intervals, and during this period an inspection and/or adjustment of the beam parameters is undertaken.

What is claimed is:
1. Device for determining the beam parameters of a focused beam of charged particles guided periodically over a target surface in electron beam melting wherein the target is the surface of a melt in an evaporation crucible, which comprises at least one probe means positioned in front of the target surface in the direction of the beam within the beam trace and in the marginal area of the crucible, said probe means being connected to an electrical display instrument for displaying the detected parameters relating to the beam with respect to the marginal area of the crucible.

2. Device of claim 1 wherein the probe means comprises an electrically conductive wire whose width is smaller than the beam diameter.

3. Device of claim 2 wherein the wire is disposed transversely to the beam movement.

4. Device of claim 3 wherein at least two wires are disposed successively in the direction of the beam movement.

5. Device of claim 1 wherein the probe means comprises a U-shaped wire loop whose crossbar is aligned transverse to the beam movement.

6. Device of claim 1 wherein the probe means comprises a U-shaped wire loop whose crossbar is aligned parallel to the beam movement.

7. Device of claim 1 wherein the probe means comprises a U-shaped wire loop, parallel to whose crossbar an additional electrically conductive wire is disposed.

8. Device of claim 1 wherein the probe means is adapted to be swung out of the beam trace.

9. Measuring process for determining the beam parameters of a focused beam of charged particles guided periodically over a target surface in electron beam vaporizing wherein the target is the surface of a melt in an evaporation crucible which comprises positioning a probe connected to an electrical display instrument in front of the target surface in the direction of radiation within the beam trace and in the marginal area of the crucible, displaying the output signal of the probe by means of a cathode ray tube, and determining the reversal point of the charged-particle beam with respect to the marginal area of the crucible on the basis of the time interval between the signal peaks in conjunction with the velocity of the beam movement.

10. Process of claim 9 wherein the output signal of the probe is displayed by means of a cathode ray tube, and the cross section of the charged-particle beam at the point of impingement is determined on the basis of the time interval between the signal flanks in conjunction with the velocity of the beam movement.

11. Process of claim 9 wherein the output signal of the probe is displayed by means of a cathode ray tube, and the velocity of movement of the charged-particle beam in the area of the probe is determined on the basis of the time interval between the signal flanks in conjunction with the crossbar length.

12. In an electron beam melting apparatus having an evaporation crucible with a melt therein and a focused beam of charged particles guided periodically over the surface of the melt, the improvement comprising: means for controlling the beam with respect to its evaporation properties and its positioning to protect the marginal area of the crucible to prevent contamination of the vaporized melt.

13. The apparatus according to claim 12, wherein the beam controlling means comprises at least one probe positioned in front of the melt surface in the direction of the beam within the beam trace and in the marginal area of the crucible and means for displaying the output of the probe corresponding to the parameters relating to the beam at the marginal area.

14. In an electron beam melting process of the type wherein a focused beam of charged particles is guided periodically over the surface of a melt in an evaporation crucible, the improvement comprising protecting the marginal area of the crucible by controlling the beam with respect to its evaporation properties and its positioning to prevent contamination of the vaporized melt.

15. The process according to claim 14, wherein the step of controlling comprises positioning at least one probe in front of the melt surface in the direction of radiation within the beam trace and in the marginal area of the crucible and displaying the output of the probe corresponding to the parameters relating to the beam at the marginal area.

* * * * *